United States Patent [19]

Morioka

[11] 4,239,359
[45] Dec. 16, 1980

[54] STEREOPHOTOGRAPHIC PROCESS FOR PRODUCING WORKS OF SCULPTURE

[76] Inventor: Isao Morioka, 3-23, Ookayama 2-chome, Meguro-ku, Tokyo, Japan

[21] Appl. No.: 8,534

[22] Filed: Feb. 1, 1979

[30] Foreign Application Priority Data

Feb. 28, 1978 [JP] Japan .................................. 53-22503

[51] Int. Cl.$^3$ ......................... G03B 35/08; B44C 3/06
[52] U.S. Cl. ....................................... 354/113; 156/58
[58] Field of Search ..................... 355/32, 77; 156/58; 354/110, 112, 113

[56] References Cited

U.S. PATENT DOCUMENTS

| | | | |
|---|---|---|---|
| 891,013 | 6/1908 | Smith | 156/58 |
| 1,527,733 | 2/1925 | Heise | 156/58 |
| 2,350,796 | 6/1944 | Morioka | 156/58 |
| 3,580,758 | 5/1971 | Morioka | 156/58 |

*Primary Examiner*—Donald A. Griffin
*Attorney, Agent, or Firm*—McGlew and Tuttle

[57] ABSTRACT

Improvements in a stereophotographic process for producing works of sculpture by arranging a number of cameras and a number of projectors, each fitted with a screen having a number of parallel stripes, in a circle around an object so as to face the latter, taking pictures of the object simultaneously with the cameras while the striped screens are being projected thereon by the projectors, replacing the projectors and cameras by an increased number of projectors arranged in similar positions to face instead a mass of material to be modeled which is placed at the center, projecting the pictures as well as the screens fitted in the projectors on the mass of material, and then modeling the material until the stripes of the same sources on the screens and pictures projected are in coincidence on the material surface. The improved process is characterized in that each pair of adjacent projectors are fitted with pictures, one for each, or a picture for one and a screen for the other to match, when projected, on the material surface, either picture or screen being positive and the other being negative, only such matchable projectors are lighted to project stripes s''' which combine the stripes s' and s'' of the positives and negatives in coincidence and also fringelike projections of unusual brightness and darkness appearing on both sides of the stripes s''' indications of unmatched stripes, and then the material is modeled by eliminating the portions represented by the projections until an original model of uniform lightness is reached.

3 Claims, 11 Drawing Figures

FIG.6
FIG.7
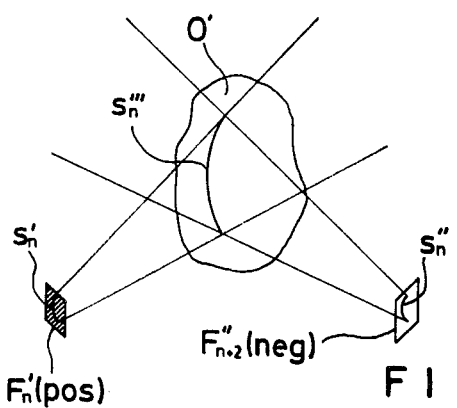
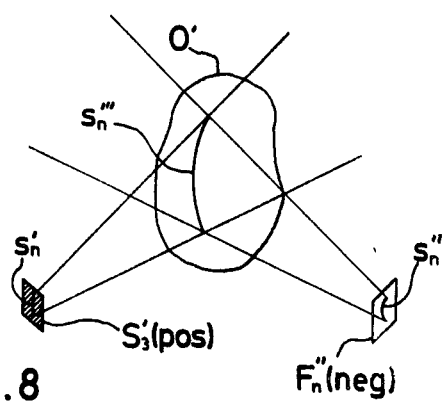
FIG.8
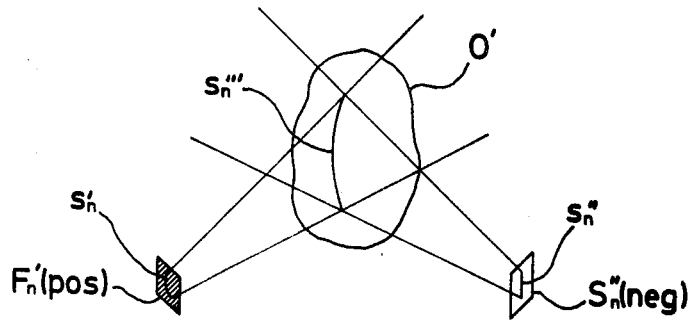
FIG.9
FIG.10
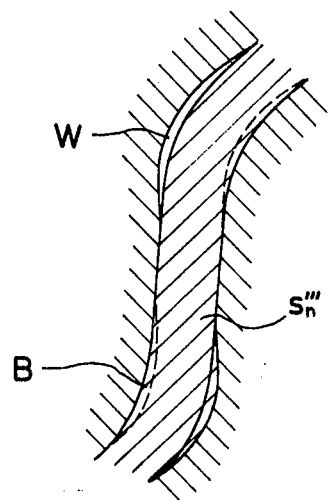
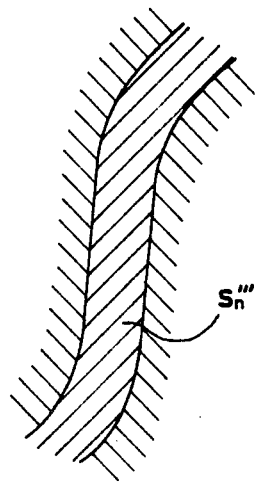

STEREOPHOTOGRAPHIC PROCESS FOR PRODUCING WORKS OF SCULPTURE

BACKGROUND OF THE INVENTION

This invention relates to improvements in a process for producing works of sculpture on the basis of stereoscopic photography.

One of the stereophotographic processes known in the art for manufacturing statuary is as follows. Some projectors and some cameras are alternately arranged in a circle around an object to face it concentrically. Each of the projectors is fitted with a screen having a number of parallel vertical lines or stripes as indicated in FIG. 2, and the projectors throw the striped patterns of the screens on the object at the center. The object in this state is photographed simultaneously with the cameras. (For the purposes of the invention the procedure up to this point is called a "photographing step".) Next, the object is replaced by a mass of material to be modeled to form a work of sculpture, that is, an original model on the basis of stereophotography. At the same time, the cameras are removed and the same number of additional projectors are installed at the corresponding points. The additional projectors are loaded with the positives of the pictures taken by the cameras in the same positions, whereas the original projectors remain fitted with the screens. Either the pictures alone or the pictures and the screens are projected on the material surface. Each picture represents the pattern of parallel stripes of the screen projected from the same point against the object and photographed, in the preceding photographing step, as deformed according to the surface configurations of the object. For example, if the object is a spherical body and screens of the pattern as shown in FIG. 2 are projected on it from both sides of a camera, the parallel stripes of the two screens will be photographed as deformed to curves as indicated in FIG. 4. Now if either two such pictures or one such screen and one such picture are projected on a mass of material by the same projectors, the material surface will look striped in black. The operator or sculptor then models the material, building up or cutting it away, so that the black stripes projected separately will meet and coincide on the material surface, when the material takes the form of an original model analogous to the object. This is a conventional process for producing statuary on the basis of stereoscopic photography.

The process renders it necessary for the sculptor to check every stripe on the material being modeled and make certain that the stripe patterns on the finished model are in perfect coincidence, even in the edge portions. This adds greatly to the production time. In addition, because frequent overlook of unmatched stripes can result from the complexity and indistinctness of the overlapping patterns, the original model thus obtained stereophotographically is sometimes not an exact replica of the object.

SUMMARY OF THE INVENTION

The present invention aims at improving the aforedescribed stereophotographic process for producing works of sculpture, and at providing a process whereby the production time is shortened and an original model is obtained which is a very fine replica of the object.

According to the invention, a stereophotographic process for producing works of sculpture is provided which comprises arranging a number of cameras and a number of projectors, each fitted with a screen having a number of parallel stripes, in a circle around an object so as to face the latter, taking pictures of the object simultaneously with the cameras while the striped screens are being projected thereon by the projectors, replacing the projectors and cameras by an increased number of projectors arranged in similar positions to face instead a mass of material to be modeled which is placed at the center, projecting the pictures as well as the screens fitted in the projectors on the mass of material, and then modeling the material until the stripes of the same sources on the screens and pictures projected are in coincidence on the material surface, characterized in that each pair of adjacent projectors are fitted with pictures, one for each, or a picture for one and a screen for the other to match, when projected, on the material surface, either picture or screen being positive and the other being negative, only such matchable projectors are lighted to project stripes $s'''$ which combine the stripes $s'$ and $s''$ of the positives and negatives in coincidence and also fringelike projections of unusual brightness and darkness appearing on both sides of the stripes $s'''$ as indications of unmatched stripes, and then the material is modeled by eliminating the portions represented by the projections until an original model of uniform lightness is reached.

In accordance with the invention a stereophotographic process for producing works of sculpture on a mass of material using a model, and a plurality of cameras and projectors is provided. Each of the projectors has a screen with a plurality of spaced parallel stripes. The method includes projecting an image of the stripes onto at least a portion of the model, taking pictures of the model portion including the image of the stripes, providing a pair of the projectors respectively with a negative and a positive of one of the pictures, projecting a negative and positive image from the pair of the projectors onto at least a portion of the mass in coincidence to form areas of variable light intensity having coincidence stripes and areas of brightness and darkness relative to the light intensity of the coincidence stripes, and sculpturing the areas of brightness and darkness relative to the coincidence stripes appearing on the mass within the coincidence negative and positive image onto a uniform lightness relative to the coincidence stripes is obtained.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

Other objects and advantages of the invention will become more apparent from the following description taken in conjunction with the accompanying drawings showing embodiments thereof.

BRIEF DESCRIPTION OF THE DRAWINGS

FIG. 6 is a schematic view of a mass of material to be modeled on which a stripe $s_n''$ of a negative picture $F_{n+2}''$ and a stripe $s_n'$ of a positive picture $F_n'$ are projected, forming a coincident stripe $s_n'''$;

FIG. 7 is a schematic view of a mass of material on which a stripe $s_n'$ of a positive screen $S_3'$ and a stripe $s_n''$ of a negative picture $F_n''$ are projected, forming a coincident stripe $s_n'''$;

FIG. 8 is a schematic view of a mass of material on which a stripe $s_n'$ of a positive picture $F_n'$ and a stripe $s_n''$ of a negative screen $S_n''$ are projected, forming a coincident stripe $s_n'''$;

FIG. 9 is a schematic view of a stripe $s_n'''$ having fringelike projections in white W and in black B along both its sides as indications of incomplete coincidence of the two stripes projected on the material surface;

FIG. 10 is a schematic view of a completely coincident stripe $s_n'''$ on the material surface.

DETAILED DESCRIPTION OF THE PREFERRED EMBODIMENTS

The method according to the invention comprises two steps of (1) taking pictures of an object and (2) making an original model on the basis of a stereophotographic image of the object, as will be described in detail below.

(1) Step of Taking Pictures of an Object

Figure 1:
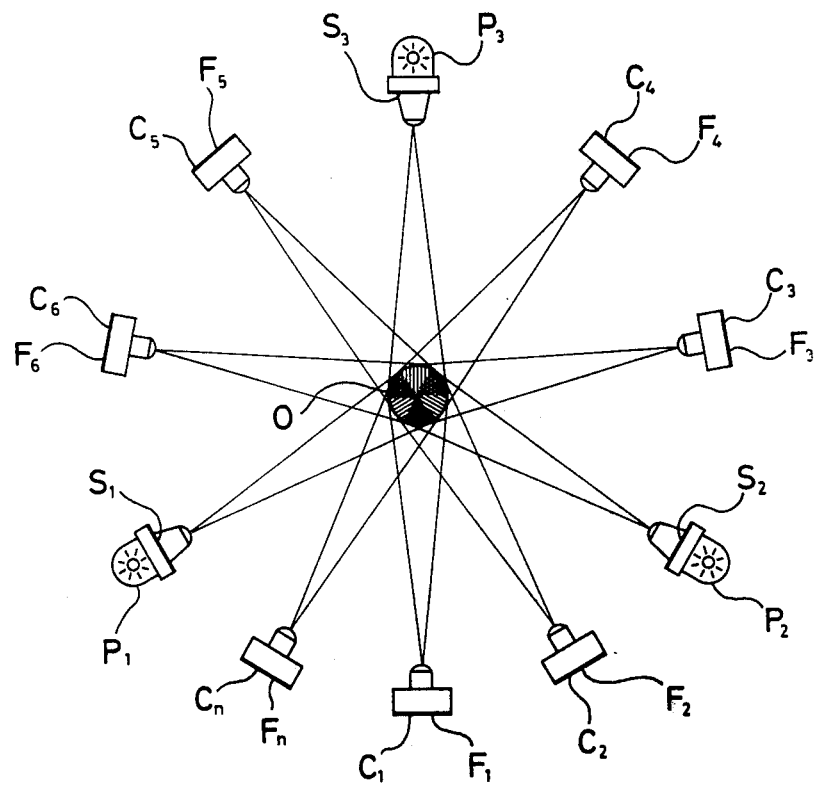
FIG. 1 is a plan view of an arrangement for stereophotographically taking pictures of an object in accordance with the process of the invention.
Figure 2:
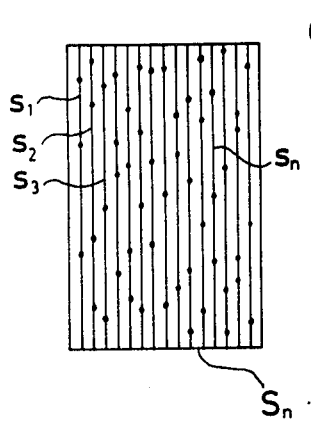
FIG. 2 is a front view of a typical screen.
Figure 3:
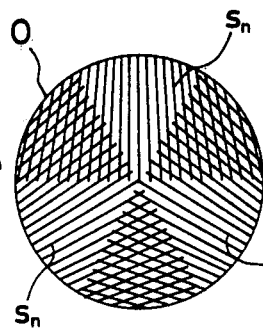
FIG. 3 is a plan view of a spherical body placed instead of a figure as an object on which beams of light through a plurality of screens are cast.
Figure 4:
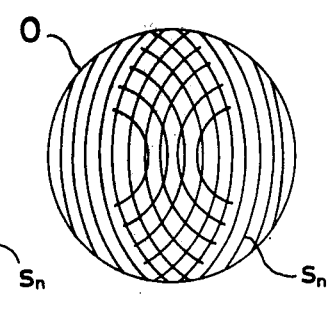
FIG. 4 is a front view of the same object.
Figure 5:
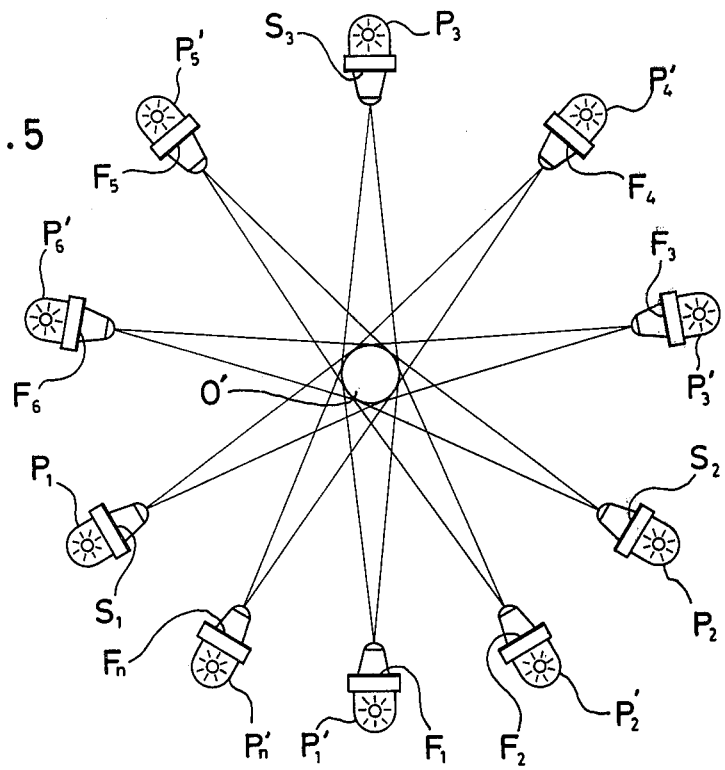
FIG. 5 is a plan view of an arrangement for making an original model on the basis of stereophotography.
Figure 11:
FIG. 11 is a photographic portrait with stripes as represented in FIG. 9.

This step will be explained with reference to FIGS. 1 to 4 of the accompanying drawings. First, around an object O (a ball being shown here in place of a figure for the sake of simplicity), a plurality of cameras $C_1$, $C_2$, $C_3$ ... $C_n$ and a plurality of projectors $P_1$, $P_2$, $P_3$ ... equipped, respectively, with screens $S_1$, $S_2$, $S_3$ ... $S_n$, each of which has parallel vertical lines or stripes $s_1$, $s_2$, $s_3$ ... $s_n$ as shown in FIG. 2, are arranged at suitable points in a circle, with their faces directed to the object O at the center. Now if the projectors $P_1$, $P_2$, $P_3$ ... throw beams of light through their screens $S_1$, $S_2$, $S_3$ ... on the object O, the parallel stripes of the respective screens will appear on the suface of the ball, as represented by a plan view in FIG. 3 and by a front view in FIG. 4. The object O with such projected patterns on its spherical surface is photographed by the cameras $C_1$, $C_2$, $C_3$ ... $C_n$.

The pictures taken with the cameras $C_1$, $C_2$, $C_3$ ... $C_n$ are herein called $F_1$, $F_2$, $F_3$ ... $F_n$, respectively. Also, positives of the screens $S_1$, $S_2$, $S_3$ ... $S_n$ designated $S_1'$, $S_2'$, $S_3'$ ... $S_n'$, negatives of the screens, $S_1''$, $S_2''$, $S_3''$ ... $S_n''$, and positives $F_1'$, $F_2'$, $F_3'$ ... $F_n'$ and negatives $F_1''$, $F_2''$, $F_3''$ ... $F_n''$ of the pictures $F_1$, $F_2$, $F_3$ ... $F_n$ are prepared. In the embodiment being described the screens $S_1$, $S_2$, $S_3$ ... $S_n$ correspond to the positives and are substantially the same as $S_1'$, $S_2'$, $S_3'$ ... $S_n'$. The designation by the symbols is merely by way of illustration.

(2) Step of Making an Original Model of Stereophotographic Image

This step will be explained with reference to FIGS. 5 through 11.

The screens $S_1$, $S_2$, $S_3$ ... $S_n$ used in the preceding step of picture taking and the positives or negatives of the photographs $F_1$, $F_2$, $F_3$ ... $F_n$ are set, respectively, in the projectors $P_1$, $P_2$, $P_3$ ... and in additional projectors $P_1'$, $P_2'$, $P_3'$ ... $P_n'$. The projectors are made ready to project beams of light through the positives or negatives on a mass of material $O'$ to form an original model on the basis of the stereophotographic image of the object, and are so arranged as to be switched on and off individually. These projectors $P_1$, $P_2$, $P_3$ and $P_1'$, $P_2'$, $P_3'$ ... $P_n'$ are installed respectively at points generally coincident with the positions the projectors $P_1$, $P_2$, $P_3$ and the cameras $C_1$, $C_2$, $C_3$ ... $C_n$ occupied during the photographing step. (Refer to FIGS. 1 and 5.) In this case, there is a free choice of positives or negatives for the screens and pictures. To be more exact, there are alternatives of $S_1'$ or $S_1''$, $S_2'$ or $S_2''$, $S_3'$ or $S_3''$ and $F_1'$ or $F_1''$, $F_2'$ or $F_2''$, $F_3'$ or $F_3''$ ..., which may be replaced with each other as desired.

Following the preparation as above described, the projectors are switched on or off in such a manner that, of the two or more projectors which throw overlapping pictues or screens on the surface of the material $O'$ to be modeled, each adjacent pair of projectors or every other or every third projectors are lighted, while the rest is all put off. Also, where either the picture or screen in a projector is a positive, a negative is used for the other. In this way the corresponding stripes from the same sources of the pictures or screens are projected on the mass of material, and therefore the operator or sculptor models the material by building up or reducing it until an original form on which the stripes coincide is reached. FIG. 6 shows that a stripe (curve) $s_n''$ of a negative picture $F_{n+2}''$ and a stripe (curve) $s_n'$ of a positive picture $F_n'$ being projected on a mass of material that has been modeled so that the two stripes are matched, forming a coincident stripe $s_n'''$ on the material surface. FIG. 7 shows a stripe (curve) $s_n''$ of a negative picture $F_n''$ and a stripe (straight) $s_n'$ of a positive screen $S_3'$ projected and matched by similar modeling, thus forming a single stripe $s_n'''$, on a mass of material. In FIG. 8 is shown a stripe $s_n'''$ similarly obtained on a mass of material by projecting a stripe (straight) $s_n''$ of a negative screen $S_n''$ and a stripe (curve) $s_n'$ of a positive picture $F_n'$ and by modeling the material until the two stripes coincide.

In the foregoing step, as can be seen from FIG. 9 (and also from FIG. 11), the coincident stripe $s_n'''$ will have fringelike projections of unusual brightness or darkness on both sides. For example, where white light sources are use, the projections look white W and/or black B. This means that the stripes $s_n'$ and $s_n''$ are not in perfect coincidence. The portions of the material represented by the white projections W and/or the black projections B must be built up or cut away until the stripes $s_n'$ and $s_n''$ meet exactly as indicated in FIG. 10. Then, the stripe $s_n'''$ is uniform, with its both sides free of the fringelike white projections W or black projections B. The stripe $s_n'''$ is now as bright as the portions of the material surface along its both sides. Extension of such a condition from stripe to stripe will produce a growing region of the same brightness (for example in gray).

In this step, the modeling up to the coincidence of all stripes $s_1'''$, $s_2'''$, $s_3'''$ ... $s_n'''$ in the manner described will remove the stripe patterns from the material surface, enabling the form to be lighted to uniform brightness. A model based on stereophotography and which is a practically exact replica of the object O is thus obtained.

For the present process it is not essential that all positive and negative pictures and screens be used in the second step. Therefore, all of the positive and negative pictures are not necessarily made in the first step of picture taking; it is merely necessary to prepare most of the pictures in positive and negative.

According to the invention, as described above, screens having a number of stripes each are projected on an object, the striped object is photographed with a number of cameras, and positives and negatives of the screens and pictures are made. Next, those pictures and screens are projected on a mass of material to be modeled so as to produce an original model. At this time, either of the adjacent pair of projectors uses a positive and the other a negative and then project them together in a matching fashion. Unmatched portions are represented by fringelike projections of unusual brightness and darkness from both sides of each stripe projected on the material surface. This representation provides a clear distinction between coincident and uncoincident portions of the stripes. Accordingly, the mass of material is modeled until the too bright and dark sidewise projections disappear from all of the stripes. The surface region of the material where the stripes are truly coincident is of uniform lightness, in contrast with the region of uncoincident stripes where the stripe patterns remain to be seen at a glance. Therefore, as compared with the prior art process which requires confirmation of individual projected stripes to make sure of the complete finish of the model, the process of the invention permits easy and rapid ascertainment of the coincidence, and hence shortening of the production period and manufacture of works of sculpture exceedingly accurate and true to the objects, on the basis of stereophotography.

What is claimed is:

1. In a stereophotographic process for producing works of sculpture by arranging a number of cameras and a number of projectors, each fitted with a screen having a number of parallel stripes, in a circle around an object so as to face the latter, taking pictures of said object simultaneously with said camera while said striped screens are being projected thereon by said projectors, replacing said projectors and cameras by an increased number of projectors arranged in similar positions to face instead a mass of material to be modeled which is placed at the center, projecting the pictures as well as said screens fitted in said projectors on said mass of material, and then modeling said material until the stripes of the same sources on said screens and pictures projected are in coincidence on the material surface, the improvement which comprises fitting each pair of adjacent projectors with a picture for one and a screen for the other to match, when projected, on said material surface, either said picture or screen being positive and the other being negative, lighting only such matchable projectors to project stripes (s''') which combine the stripes (s' and s'') of said positives and negatives in coincidence and form fringelike projections of unusual brightness and darkness appearing on both sides of said stripes (s''') as indications of unmatched stripes, and then modeling said material by eliminating the portions represented by said projections until an original model of uniform lightness is reached.

2. A process according to claim 1, wherein said fringelike projections of unusual brightness and darkness appearing on both sides of said stripes (s''') as indications of unmatched stripes are white and black.

3. A stereophotographic process for producing works of sculpture on a mass of material, using a model, and a plurality of cameras and projectors, each of said projectors having a screen with a plurality of spaced parallel stripes, comprising projecting an image of said stripes onto at least a portion of the model, taking pictures of said model portion including said image of said stripes, providing a pair of the projectors respectively with a negative of one of said pictures and a screen, projecting a negative image of said negative and a positive image of said screen from said pair of projectors onto at least a portion of said mass of material in coincidence to form areas of variable light intensity having coincidence stripes and areas of brightness and darkness relative to the light intensity of said coincidence stripes, and sculpturing said areas of brightness and darkness relative to said coincidence stripes appearing on said mass within said coincident negative and positive image until a uniform lightness relative to said coincidence stripes is obtained.

* * * * *